United States Patent
Okita et al.

(10) Patent No.: US 12,031,233 B2
(45) Date of Patent: Jul. 9, 2024

(54) SILICON CARBIDE SUBSTRATE

(71) Applicant: SUMITOMO ELECTRIC INDUSTRIES, LTD., Osaka (JP)

(72) Inventors: Kyoko Okita, Osaka (JP); Tsubasa Honke, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 244 days.

(21) Appl. No.: 17/611,139

(22) PCT Filed: Apr. 1, 2020

(86) PCT No.: PCT/JP2020/015006
§ 371 (c)(1),
(2) Date: Nov. 13, 2021

(87) PCT Pub. No.: WO2020/235225
PCT Pub. Date: Nov. 26, 2020

(65) Prior Publication Data
US 2022/0220638 A1    Jul. 14, 2022

(30) Foreign Application Priority Data
May 17, 2019  (JP) ................. 2019-093882

(51) Int. Cl.
| | | |
|---|---|---|
| *B32B 3/00* | (2006.01) | |
| *C30B 29/36* | (2006.01) | |
| *H01L 21/02* | (2006.01) | |
| *H01L 29/16* | (2006.01) | |
| *H01L 29/36* | (2006.01) | |
| *C30B 23/02* | (2006.01) | |

(52) U.S. Cl.
CPC ........ *C30B 29/36* (2013.01); *H01L 21/02021* (2013.01); *H01L 21/02024* (2013.01); *H01L 21/02052* (2013.01); *H01L 29/1608* (2013.01); *H01L 29/36* (2013.01); *C30B 23/02* (2013.01)

(58) Field of Classification Search
CPC .......................... C30B 29/36; H01L 29/1608
See application file for complete search history.

(56) References Cited

U.S. PATENT DOCUMENTS

| | | | |
|---|---|---|---|
| 2013/0174868 A1 | 7/2013 | Muraoka | |
| 2017/0306526 A1* | 10/2017 | Okita | ................. B24B 37/042 |
| 2018/0195952 A1 | 7/2018 | Mizutani | |

FOREIGN PATENT DOCUMENTS

| | | |
|---|---|---|
| CN | 104114755 A | 10/2014 |
| JP | 11-162917 A | 6/1999 |
| JP | 2008-004879 A | 1/2008 |
| JP | 2008-182248 A | 8/2008 |
| JP | 2008-280207 A | 11/2008 |
| JP | 2016-56057 A | 4/2016 |

(Continued)

*Primary Examiner* — Elizabeth E Mulvaney
(74) *Attorney, Agent, or Firm* — Renner, Otto, Boisselle & Sklar, LLP

(57) ABSTRACT

A silicon carbide substrate in accordance with the present disclosure includes a main surface. The silicon carbide substrate has a maximum diameter of 150 mm or more. In the main surface, a total area of a region in which a concentration of each of sodium, aluminum, potassium, calcium, titanium, iron, copper, and zinc is less than $5 \times 10^{10}$ atoms/cm$^2$ is more than or equal to 95% of an area of the main surface.

9 Claims, 5 Drawing Sheets

(56) References Cited

FOREIGN PATENT DOCUMENTS

| JP | 2016-155757 A | 9/2016 |
| JP | 2016-174162 A | 9/2016 |
| WO | 2012/043496 A1 | 4/2012 |
| WO | 2016/063632 A1 | 4/2016 |
| WO | 2017/078127 A1 | 5/2017 |

* cited by examiner

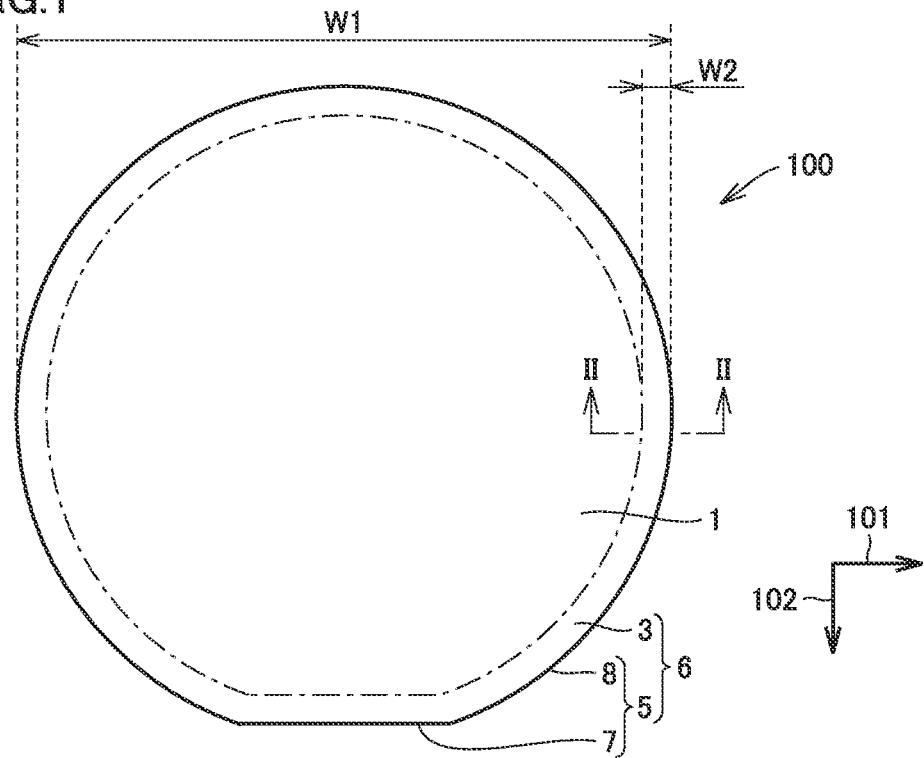
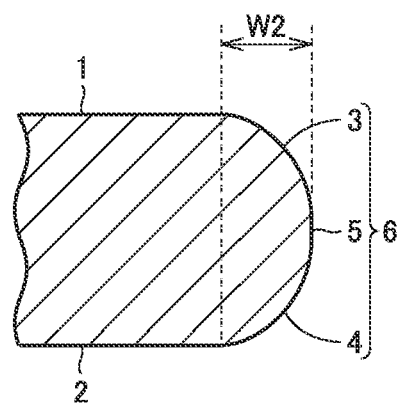

SILICON CARBIDE SUBSTRATE

TECHNICAL FIELD

The present disclosure relates to a silicon carbide substrate. The present application claims priority to Japanese Patent Application No. 2019-093882 filed on May 17, 2019, the entire contents of which are incorporated herein by reference.

BACKGROUND ART

WO 2016/063632 (PTL 1) describes a method for cleaning a silicon carbide substrate.

CITATION LIST

Patent Literature

PTL 1: WO 2016/063632

SUMMARY OF INVENTION

A silicon carbide substrate in accordance with the present disclosure includes a main surface. The silicon carbide substrate has a maximum diameter of 150 mm or more. In the main surface, a total area of a region in which a concentration of each of sodium, aluminum, potassium, calcium, titanium, iron, copper, and zinc is less than $5 \times 10^{10}$ atoms/cm$^2$ is more than or equal to 95% of an area of the main surface.

BRIEF DESCRIPTION OF DRAWINGS

FIG. 1 is a schematic plan view showing a configuration of a silicon carbide substrate in accordance with the present embodiment.

FIG. 2 is a schematic cross sectional view taken along a line II-II in FIG. 1.

DETAILED DESCRIPTION

Figure 3:
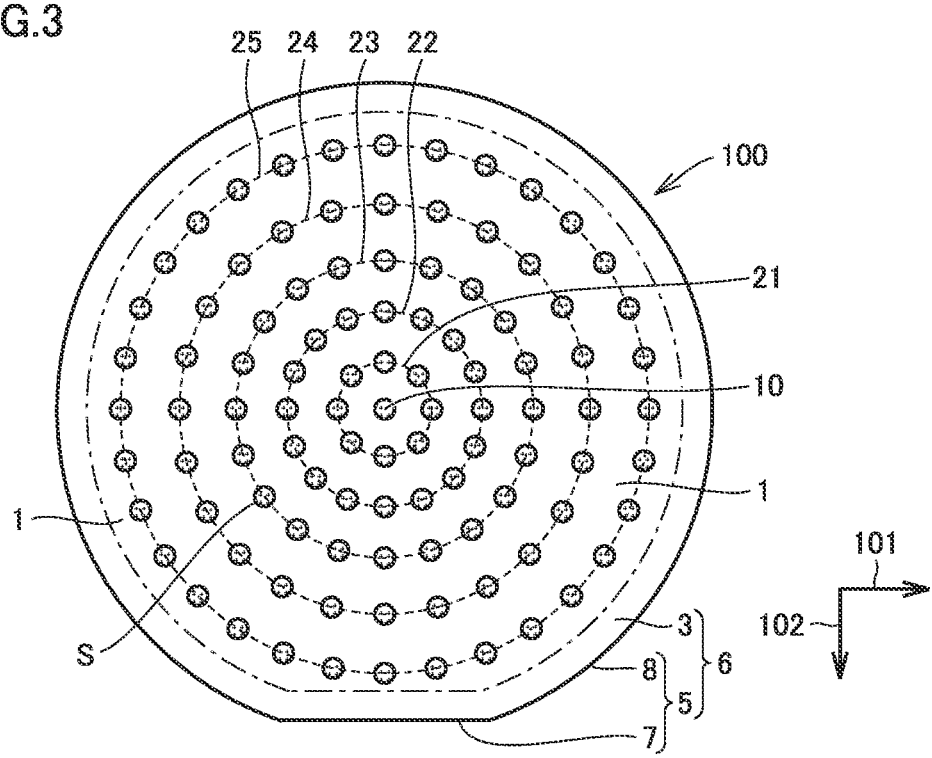
FIG. 3 is a schematic plan view showing measurement regions for a metal impurity.

Problem to be Solved by the Present Disclosure

An object of the present disclosure is to provide a silicon carbide substrate with a high cleanliness.

Advantageous Effect of the Present Disclosure

According to the present disclosure, a silicon carbide substrate with a high cleanliness can be provided.

Description of the Embodiment of the Present Disclosure

First, an embodiment of the present disclosure will be described in list form.

(1) A silicon carbide substrate 100 in accordance with the present disclosure includes a main surface 1. Silicon carbide substrate 100 has a maximum diameter of 150 mm or more. In main surface 1, a total area of a region in which a concentration of each of sodium, aluminum, potassium, calcium, titanium, iron, copper, and zinc is less than $5 \times 10^{10}$ atoms/cm$^2$ is more than or equal to 95% of an area of main surface 1.

(2) According to silicon carbide substrate 100 in accordance with (1) described above, the total area may be more than or equal to 98% of the area of main surface 1.

(3) According to silicon carbide substrate 100 in accordance with (1) or (2) described above, sulfur may be present in main surface 1. A region in which a concentration of sulfur is more than or equal to $5 \times 10^{10}$ atoms/cm$^2$ may be more than or equal to 1% of the area of main surface 1.

(4) According to silicon carbide substrate 100 in accordance with (3) described above, the region in which the concentration of sulfur is more than or equal to $5 \times 10^{10}$ atoms/cm$^2$ may be more than or equal to 50% of the area of main surface 1.

(5) According to silicon carbide substrate 100 in accordance with any of (1) to (4) described above, chlorine may be present in main surface 1. A region in which a concentration of chlorine is more than or equal to $5 \times 10^{10}$ atoms/cm$^2$ may be more than or equal to 1% of the area of main surface 1.

(6) According to silicon carbide substrate 100 in accordance with (5) described above, the region in which the concentration of chlorine is more than or equal to $5 \times 10^{10}$ atoms/cm$^2$ may be more than or equal to 50% of the area of main surface 1.

(7) According to silicon carbide substrate 100 in accordance with any of (1) to (6) described above, in main surface 1, a region in which the concentration of aluminum is more than or equal to $1 \times 10^{12}$ atoms/cm$^2$ may be less than 1% of the area of main surface 1.

(8) According to silicon carbide substrate 100 in accordance with any of (1) to (7) described above, in main surface 1, a region in which the concentration of potassium is more than or equal to $1 \times 10^{12}$ atoms/cm$^2$ may be less than 1% of the area of main surface 1.

(9) According to silicon carbide substrate 100 in accordance with any of (1) to (8) described above, in main surface 1, a region in which the concentration of calcium is more than or equal to $1 \times 10^{12}$ atoms/cm$^2$ may be less than 1% of the area of main surface 1.

Details of the Embodiment of the Present Disclosure

Hereinafter, the embodiment of the present disclosure will be described based on the drawings. It should be noted that, in the drawings below, identical or corresponding parts will be designated by the same reference numerals, and the description thereof will not be repeated. Regarding crystallographic indications in the present specification, an individual orientation is represented by [ ], a group orientation is represented by < >, an individual plane is represented by ( ), and a group plane is represented by { }. Generally, a negative index is supposed to be crystallographically indicated by putting "–" (bar) above a numeral, but is indicated by putting the negative sign before the numeral in the present specification.

<Configuration of Silicon Carbide Substrate>

First, a configuration of silicon carbide substrate 100 in accordance with the present embodiment will be described. FIG. 1 is a schematic plan view showing a configuration of silicon carbide substrate 100 in accordance with the present embodiment. FIG. 2 is a schematic cross sectional view taken along a line II-II in FIG. 1.

As shown in FIGS. 1 and 2, silicon carbide substrate 100 in accordance with the present embodiment mainly has a first main surface 1, a second main surface 2, and a chamfered portion 6. Second main surface 2 is opposite to first main surface 1. Chamfered portion 6 is contiguous to each of first main surface 1 and second main surface 2. Each of first main surface 1 and second main surface 2 is a flat surface. First main surface 1 is a surface on which an epitaxial layer (not shown) is to be formed. Silicon carbide substrate 100 is made of a hexagonal silicon carbide single crystal having a polytype of 4H, for example. Silicon carbide substrate 100 contains an n type impurity such as nitrogen, for example.

First main surface 1 is a {0001} plane, or a plane angled off by less than or equal to 8° relative to the {0001} plane, for example. Specifically, first main surface 1 is a (0001) plane, or a plane angled off by less than or equal to 8° relative to the (0001) plane, for example. First main surface 1 may be a (000-1) plane, or a plane angled off by less than or equal to 8° relative to the (000-1) plane, for example. When first main surface 1 is the (0001) plane, second main surface 2 is the (000-1) plane.

As shown in FIG. 2, chamfered portion 6 has a first curved region 3, an outer circumferential end portion 5, and a second curved region 4. First curved region 3 is contiguous to first main surface 1. First curved region 3 is located more outward than first main surface 1. Second curved region 4 is contiguous to second main surface 2. Second curved region 4 is located more outward than second main surface 2. As shown in FIG. 2, in a cross section perpendicular to first main surface 1, each of first curved region 3 and second curved region 4 is arc-shaped. Each of first curved region 3 and second curved region 4 is curved to protrude outward.

Outer circumferential end portion 5 is a portion located most outward in a radial direction parallel to first main surface 1. Outer circumferential end portion 5 is contiguous to each of first curved region 3 and second curved region 4. In the radial direction, first curved region 3 is located between first main surface 1 and outer circumferential end portion 5. Similarly, in the radial direction, second curved region 4 is located between second main surface 2 and outer circumferential end portion 5.

As shown in FIG. 1, outer circumferential end portion 5 has an orientation flat portion 7 and an arc-shaped portion 8. Arc-shaped portion 8 is contiguous to orientation flat portion 7. Orientation flat portion 7 extends along a first direction 101. Each of first direction 101 and a second direction 102 is parallel to first main surface 1. Second direction 102 is a direction perpendicular to first direction 101. First direction 101 is a <11-20> direction, for example. Second direction 102 is a <1-100> direction, for example.

When first main surface 1 is inclined relative to the {0001} plane, first direction 101 may be a direction in which the <11-20> direction is projected to first main surface 1, for example. When first main surface 1 is inclined relative to the {0001} plane, second direction 102 may be a direction in which the <1-100> direction is projected to first main surface 1, for example.

As shown in FIG. 1, silicon carbide substrate 100 has a maximum diameter (a first width W1) of 150 mm or more. When viewed in a direction perpendicular to first main surface 1, the maximum diameter of silicon carbide substrate 100 may be calculated as a diameter of a circle including arc-shaped portion 8. First width W1 may be 200 mm or more, or may be 250 mm or more. The upper limit of first width W1 is not particularly limited, and may be 300 mm or less, for example.

As shown in FIG. 1, when viewed in the direction perpendicular to first main surface 1, chamfered portion 6 has a width (a second width W2) of 2 mm or more and 3 mm or less, for example. From another viewpoint, when viewed in the direction perpendicular to first main surface 1, a distance from a boundary between first main surface 1 and chamfered portion 6 to outer circumferential end portion 5 is 2 mm or more and 3 mm or less, for example.

Next, a concentration of a metal impurity in first main surface 1 will be described.

According to silicon carbide substrate 100 in accordance with the present embodiment, in first main surface 1, a total area of a region in which a concentration of each of sodium (Na), aluminum (Al), potassium (K), calcium (Ca), titanium (Ti), iron (Fe), copper (Cu), and zinc (Zn) is less than $5\times10^{10}$ atoms/cm$^2$ may be more than or equal to 95% of an area of first main surface 1. From another viewpoint, in first main surface 1, a total area of a region in which the concentration of each of sodium (Na), aluminum (Al), potassium (K), calcium (Ca), titanium (Ti), iron (Fe), copper (Cu), and zinc (Zn) is more than or equal to $5\times10^{10}$ atoms/cm$^2$ may be less than 5% of the area of main surface 1. That is, the concentration of a metal impurity is low in a region of more than or equal to 95% of first main surface 1.

Preferably, in first main surface 1, the total area of the region in which the concentration of each of sodium, aluminum, potassium, calcium, titanium, iron, copper, and zinc is less than $5\times10^{10}$ atoms/cm$^2$ may be more than or equal to 98% of the area of main surface 1, or may be more than or equal to 98.5% of the area of main surface 1. From another viewpoint, the total area of the region in which the concentration of each of sodium (Na), aluminum (Al), potassium (K), calcium (Ca), titanium (Ti), iron (Fe), copper (Cu), and zinc (Zn) is more than or equal to $5\times10^{10}$ atoms/cm$^2$ may be less than 2% of the area of main surface 1, or may be less than 1.5% of the area of main surface 1.

Sulfur may be present in first main surface 1. A region in which a concentration of sulfur (S) is more than or equal to $5\times10^{10}$ atoms/cm$^2$ may be more than or equal to 1% of the area of first main surface 1. The region in which the concentration of sulfur is more than or equal to $5\times10^{10}$ atoms/cm$^2$ may be more than or equal to 25% of the area of first main surface 1, more than or equal to 50% of the area of first main surface 1, or more than or equal to 60% of the area of first main surface 1. The lower limit of the region in which the concentration of sulfur is more than or equal to $5\times10^{10}$ atoms/cm$^2$ is not particularly limited, and may be less than or equal to 75% of the area of first main surface 1, for example.

A region in which the concentration of sulfur (S) is more than or equal to $1\times10^{12}$ atoms/cm$^2$ may be more than or equal to 1% of the area of first main surface 1. The region in which the concentration of sulfur is more than or equal to $1\times10^{12}$ atoms/cm$^2$ may be more than or equal to 25% of the area of first main surface 1, more than or equal to 50% of the area of first main surface 1, or more than or equal to 60% of the area of first main surface 1. The lower limit of the region in which the concentration of sulfur is more than or equal to $1×10^{12}$ atoms/cm$^2$ is not particularly limited, and may be less than or equal to 75% of the area of first main surface 1, for example.

Chlorine may be present in first main surface 1. A region in which a concentration of chlorine (Cl) is more than or equal to $5×10^{10}$ atoms/cm$^2$ may be more than or equal to 1% of the area of first main surface 1. The region in which the concentration of chlorine is more than or equal to $5×10^{10}$ atoms/cm$^2$ may be more than or equal to 25% of the area of first main surface 1, more than or equal to 50% of the area of first main surface 1, or more than or equal to 60% of the area of first main surface 1. The lower limit of the region in which the concentration of chlorine is more than or equal to $5×10^{10}$ atoms/cm$^2$ is not particularly limited, and may be less than or equal to 75% of the area of first main surface 1, for example.

A region in which the concentration of chlorine (Cl) is more than or equal to $1×10^{12}$ atoms/cm$^2$ may be more than or equal to 1% of the area of first main surface 1. The region in which the concentration of chlorine is more than or equal to $1×10^{12}$ atoms/cm$^2$ may be more than or equal to 25% of the area of first main surface 1, more than or equal to 50% of the area of first main surface 1, or more than or equal to 60% of the area of first main surface 1. The lower limit of the region in which the concentration of chlorine is more than or equal to $1×10^{12}$ atoms/cm$^2$ is not particularly limited, and may be less than or equal to 75% of the area of first main surface 1, for example.

In first main surface 1, a region in which the concentration of aluminum is more than or equal to $1×10^{12}$ atoms/cm$^2$ may be less than 1% of the area of first main surface 1. In first main surface 1, there may be no region in which the concentration of aluminum is more than or equal to $1×10^{12}$ atoms/cm$^2$.

In first main surface 1, a region in which the concentration of potassium is more than or equal to $1×10^{12}$ atoms/cm$^2$ may be less than 1% of the area of first main surface 1. In first main surface 1, there may be no region in which the concentration of potassium is more than or equal to $1×10^{12}$ atoms/cm$^2$.

In first main surface 1, a region in which the concentration of calcium is more than or equal to $1×10^{12}$ atoms/cm$^2$ may be less than 1% of the area of first main surface 1. In first main surface 1, there may be no region in which the concentration of calcium is more than or equal to $1×10^{12}$ atoms/cm$^2$.

Next, a method for measuring the concentration of a metal impurity in first main surface 1 will be described.

The concentration of a metal impurity can be measured with a total reflection fluorescent X-ray analysis device. As the analysis device, TXRF-3760 manufactured by Rigaku can be used, for example. The analysis device has a plurality of excited X-ray sources, and can measure an element from a light element Na to a heavy element U using an excited X-ray optimal for the measured element. Specifically, an excited X-ray of W-Ma (1.78 keV) is used for Na, Al, and Mg, and an excited X-ray of W-Lb (9.67 keV) is used for an element with an atomic number which is greater than that of K and is up to that of U (in particular, K, Ca, Ti, Cr, Mn, Fe, Co, Ni, Cu, Zn, Cl, and S).

The power of the X-ray is 35 kV-255 mA, for example. The incidence azimuth is 39°. The incident angle of W-Ma is 0.500°. The measurement time of W-Ma is 10 seconds/point. The incident angle of W-Lb is 0.100°. The measurement time of W-Lb is 10 seconds/point. Further, the analysis device has an XY drive stage, and can measure in-plane distribution of the measured element. For example, first main surface 1 is divided into 101 regions having an equal area, and the concentration of the measured element can be measured at each of the 101 regions. The concentration of a metal impurity is the number of atoms per unit area.

FIG. 3 is a schematic plan view showing measurement regions for a metal impurity. As shown in FIG. 3, first main surface 1 has a center 10, a first virtual circle 21, a second virtual circle 22, a third virtual circle 23, a fourth virtual circle 24, and a fifth virtual circle 25. The interval between first virtual circle 21 and second virtual circle 22 is the same as the interval between second virtual circle 22 and third virtual circle 23. The interval between second virtual circle 22 and third virtual circle 23 is the same as the interval between third virtual circle 23 and fourth virtual circle 24. The interval between third virtual circle 23 and fourth virtual circle 24 is the same as the interval between fourth virtual circle 24 and fifth virtual circle 25.

In FIG. 3, each circle having dots represents a measurement region S for a metal impurity. The size of measurement region S is 10 mm φ. Measurement regions S are provided at regular intervals along a straight line which passes through center 10 of first main surface 1 and is parallel to first direction 101. Measurement regions S are provided at regular intervals along a straight line which passes through center 10 of first main surface 1 and is parallel to second direction 102. One measurement region S is provided at center 10 of first main surface 1. Eight measurement regions S are provided at regular intervals along first virtual circle 21. Sixteen measurement regions S are provided at regular intervals along second virtual circle 22. Twenty measurement regions S are provided at regular intervals along third virtual circle 23. Twenty-four measurement regions S are provided at regular intervals along fourth virtual circle 24. Thirty-two measurement regions S are provided at regular intervals along fifth virtual circle 25. That is, 101 measurement regions S are provided in total in first main surface 1.

For example, in measurement region S including center 10 of first main surface 1 (a first measurement region), the concentration of each of sodium (Na), aluminum (Al), potassium (K), calcium (Ca), titanium (Ti), iron (Fe), copper (Cu), and zinc (Zn) is measured. In the first measurement region, whether or not the concentration of each of sodium (Na), aluminum (Al), potassium (K), calcium (Ca), titanium (Ti), iron (Fe), copper (Cu), and zinc (Zn) is less than $5×10^{10}$ atoms/cm$^2$ is determined.

Then, in a second measurement region next to the first measurement region, the concentration of each of sodium (Na), aluminum (Al), potassium (K), calcium (Ca), titanium (Ti), iron (Fe), copper (Cu), and zinc (Zn) is measured. In the second measurement region, whether or not the concentration of each of sodium (Na), aluminum (Al), potassium (K), calcium (Ca), titanium (Ti), iron (Fe), copper (Cu), and zinc (Zn) is less than $5×10^{10}$ atoms/cm$^2$ is determined.

As described above, in 101 measurement regions S from the first measurement region to a 101st measurement region, whether or not the concentration of each of sodium (Na), aluminum (Al), potassium (K), calcium (Ca), titanium (Ti), iron (Fe), copper (Cu), and zinc (Zn) is less than $5×10^{10}$ atoms/cm$^2$ is determined. For example, when the concentration of each of sodium (Na), aluminum (Al), potassium (K), calcium (Ca), titanium (Ti), iron (Fe), copper (Cu), and zinc (Zn) is less than $5×10^{10}$ atoms/cm$^2$ in N measurement region(s) S of 101 measurement regions S, the total area of the region in which the concentration of each of sodium (Na), aluminum (Al), potassium (K), calcium (Ca), titanium (Ti), iron (Fe), copper (Cu), and zinc (Zn) is less than $5\times10^{10}$ atoms/cm$^2$ is calculated as the area of first main surface $1\times N/101$.

It should be noted that, although it has been described above that the main surface is first main surface 1, the main surface may be second main surface 2. From another viewpoint, a concentration of a metal impurity in second main surface 2 may be the same as the concentration of the metal impurity in first main surface 1.

<Method for Manufacturing Silicon Carbide Substrate>

Figure 4:
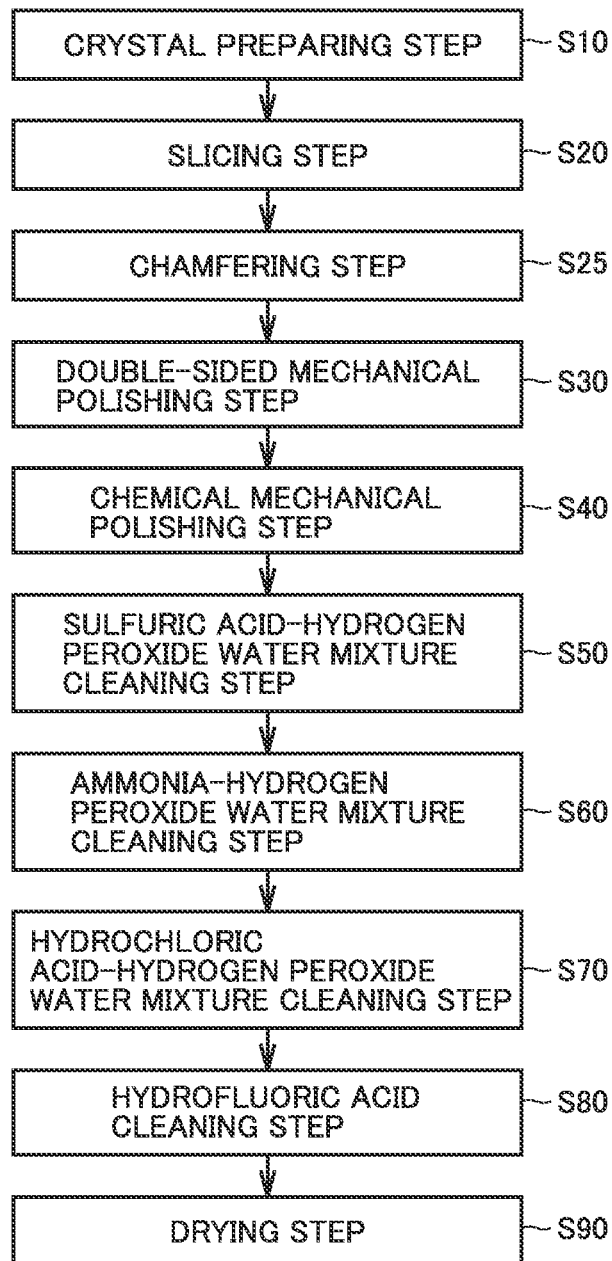
FIG. 4 is a flowchart schematically showing a method for manufacturing the silicon carbide substrate in accordance with the present embodiment.

Next, a method for manufacturing silicon carbide substrate 100 in accordance with the present embodiment will be described. As shown in FIG. 4, the method for manufacturing silicon carbide substrate 100 in accordance with the present embodiment includes a crystal preparing step (S10), a slicing step (S20), a chamfering step (S25), a double-sided mechanical polishing step (S30), a chemical mechanical polishing step (S40), a sulfuric acid-hydrogen peroxide water mixture cleaning step (S50), an ammonia-hydrogen peroxide water mixture cleaning step (S60), a hydrochloric acid-hydrogen peroxide water mixture cleaning step (S70), a hydrofluoric acid cleaning step (S80), and a drying step (S90).

First, the crystal preparing step (S10) is performed. In the crystal preparing step (S10), a silicon carbide ingot is formed by a sublimation method, for example. Then, the slicing step (S20) is performed. In the slicing step (S20), the silicon carbide ingot is cut into a plurality of silicon carbide substrates 100 by a saw wire. Silicon carbide substrate 100 is made of a hexagonal silicon carbide single crystal having a polytype of 4H, for example. As shown in FIG. 1, silicon carbide substrate 100 has first main surface 1, second main surface 2, and outer circumferential end portion 5. At this point of time, chamfered portion 6 is not formed.

Then, the chamfering step (S25) is performed. In the chamfering step (S25), a grinding device (not shown) is used. In the chamfering step, a diamond grinding stone is used, for example. The vicinity of a boundary between first main surface 1 and outer circumferential end portion 5 of silicon carbide substrate 100 is pressed against the rotating diamond grinding stone. Similarly, the vicinity of a boundary between first main surface 1 and outer circumferential end portion 5 of silicon carbide substrate 100 is pressed against the rotating diamond grinding stone. Thereby, chamfered portion 6 is formed in silicon carbide substrate 100 (see FIG. 2). In the chamfering step (S25), grinding marks may be formed in chamfered portion 6.

Then, the double-sided mechanical polishing step (S30) is performed. Specifically, silicon carbide substrate 100 is placed between a first surface plate (not shown) and a second surface plate (not shown) such that first main surface 1 faces the first surface plate and second main surface 2 corresponds to the second surface plate. Then, slurry is introduced between first main surface 1 and the first surface plate and between second main surface 2 and the second surface plate. The slurry contains diamond abrasive grains and water, for example. The diamond abrasive grains have diameters of 1 μm or more and 3 μm or less, for example. Mechanical polishing is performed on both sides of silicon carbide substrate 100 by applying a load to first main surface 1 by the first surface plate and applying a load to second main surface 2 by the second surface plate.

Then, the chemical mechanical polishing step (S40) is performed. Specifically, chemical mechanical polishing is performed in first main surface 1 of silicon carbide substrate 100. As abrasive grains, colloidal silica is used, for example. A polishing solution containing a permanganate is used. A polishing cloth is attached to a surface plate. The polishing cloth is a nonwoven fabric, for example. The processing pressure is 300 g/cm$^2$, for example. The flow rate of the polishing solution is 50 cc/minute, for example. The number of rotations of the surface plate is 40 rpm, for example. The processing time is two hours, for example.

Figure 5:
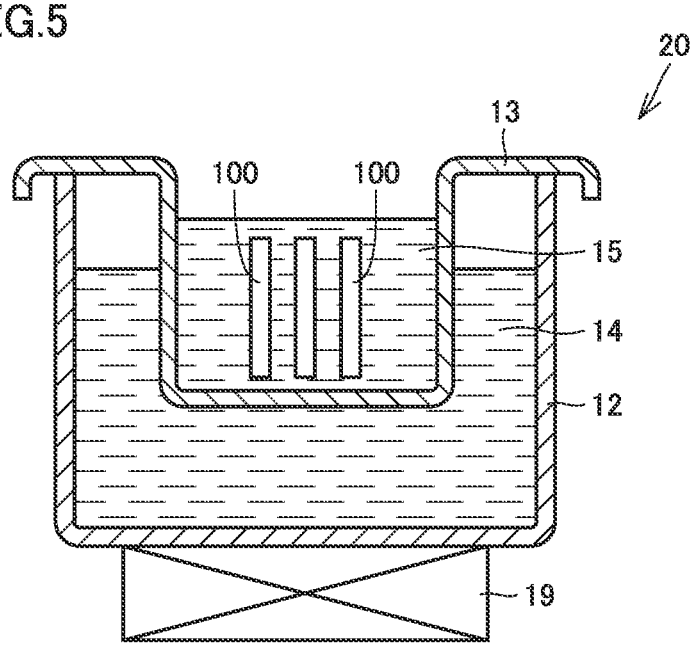
FIG. 5 is a schematic cross sectional view showing a first step of the method for manufacturing the silicon carbide substrate in accordance with the present embodiment.

Then, the sulfuric acid-hydrogen peroxide water mixture cleaning step (S50) is performed. In the sulfuric acid-hydrogen peroxide water mixture cleaning step (S50), an ultrasonic wave cleaning device is used. As shown in FIG. 5, an ultrasonic wave cleaning device 20 mainly has an ultrasonic wave generation source 19, a first cleaning tank 12, and a second cleaning tank 13. Second cleaning tank 13 is placed on first cleaning tank 12. Second cleaning tank 13 is hung on an opening of first cleaning tank 12. A first cleaning solution 14 (specifically, water) is put in first cleaning tank 12. A second cleaning solution 15 (specifically, a sulfuric acid-hydrogen peroxide water mixture) is put in second cleaning tank 13. Silicon carbide substrate 100 is immersed in the sulfuric acid-hydrogen peroxide water mixture. Ultrasonic wave generation source 19 is placed at the bottom of second cleaning tank 13. Second cleaning tank 13 is placed on ultrasonic wave generation source 19.

In the sulfuric acid-hydrogen peroxide water mixture cleaning step (S50), silicon carbide substrate 100 is cleaned with the sulfuric acid-hydrogen peroxide water mixture being irradiated with ultrasonic waves, in order to improve the effect of removing a metal impurity. The ultrasonic waves have a frequency of 450 kHz or more and 2 MHz or less, for example. The ultrasonic waves promote a chemical reaction. This enhances the reactivity of the metal impurity to the sulfuric acid-hydrogen peroxide water mixture. Further, sludge containing manganese which has entered the grinding marks in chamfered portion 6 can be effectively removed by a cavitation effect caused by irradiation of the ultrasonic waves.

In the sulfuric acid-hydrogen peroxide water mixture cleaning step (S50), an organic substance, a metal impurity, and the like are mainly removed. The sulfuric acid-hydrogen peroxide water mixture is a solution in which sulfuric acid, hydrogen peroxide water, and ultrapure water are mixed. As the sulfuric acid, concentrated sulfuric acid having a mass percentage concentration of 96% can be used, for example. As the hydrogen peroxide water, hydrogen peroxide water having a mass percentage concentration of 30% can be used, for example. The same applies to the hydrogen peroxide water used in the subsequent steps.

The volume ratio among the sulfuric acid, the hydrogen peroxide water, and the ultrapure water contained in the sulfuric acid-hydrogen peroxide water mixture is from 10 (sulfuric acid):1 (hydrogen peroxide water):1 (ultrapure water) to 10 (sulfuric acid):3 (hydrogen peroxide water):1 (ultrapure water), for example. In other words, the volume of the sulfuric acid is 10 times the volume of the ultrapure water. The volume of the hydrogen peroxide water is one time or more and three times or less of the volume of the ultrapure water. The immersion time of silicon carbide substrate 100 is five minutes or more, for example. The temperature of the sulfuric acid-hydrogen peroxide water mixture is room temperature, for example.

Then, the ammonia-hydrogen peroxide water mixture cleaning step (S60) is performed. In the ammonia-hydrogen peroxide water mixture cleaning step (S60), a polishing agent and dust are mainly removed. An ammonia-hydrogen peroxide water mixture is a solution in which an aqueous ammonia solution, hydrogen peroxide water, and ultrapure water are mixed. As the aqueous ammonia solution, an aqueous ammonia solution having a mass percentage concentration of 28% can be used, for example. In the ammonia-hydrogen peroxide water mixture cleaning step (S60), silicon carbide substrate 100 may be cleaned with the ammonia-hydrogen peroxide water mixture being irradiated with ultrasonic waves.

The volume ratio among the aqueous ammonia solution, the hydrogen peroxide water, and the ultrapure water contained in the ammonia-hydrogen peroxide water mixture is from 1 (aqueous ammonia solution):1 (hydrogen peroxide water):5 (ultrapure water) to 1 (aqueous ammonia solution):1 (hydrogen peroxide water):10 (ultrapure water). In other words, the volume of the aqueous ammonia solution is 1/10 or more and 1/5 or less of the volume of the ultrapure water. Further, the volume of the hydrogen peroxide water is 1/10 or more and 1/5 or less of the volume of the ultrapure water. The immersion time of silicon carbide substrate 100 is five minutes or more, for example. The temperature of the sulfuric acid-hydrogen peroxide water mixture is room temperature, for example.

Then, the hydrochloric acid-hydrogen peroxide water mixture cleaning step (S70) is performed. In the hydrochloric acid-hydrogen peroxide water mixture cleaning step (S70), a heavy metal is mainly removed. A hydrochloric acid-hydrogen peroxide water mixture is a solution in which hydrochloric acid, hydrogen peroxide water, and ultrapure water are mixed. As the hydrochloric acid, concentrated hydrochloric acid having a mass percentage concentration of 98% can be used, for example. In the hydrochloric acid-hydrogen peroxide water mixture cleaning step (S70), silicon carbide substrate 100 may be cleaned with the hydrochloric acid-hydrogen peroxide water mixture being irradiated with ultrasonic waves.

The volume ratio among the hydrochloric acid, the hydrogen peroxide water, and the ultrapure water contained in the hydrochloric acid-hydrogen peroxide water mixture is from 1 (hydrochloric acid):1 (hydrogen peroxide water):5 (ultrapure water) to 1 (hydrochloric acid):1 (hydrogen peroxide water):10 (ultrapure water), for example. In other words, the volume of the hydrochloric acid is 1/10 or more and 1/5 or less of the volume of the ultrapure water. Further, the volume of the hydrogen peroxide water is 1/10 or more and 1/5 or less of the volume of the ultrapure water. The immersion time of silicon carbide substrate 100 is five minutes or more, for example. The temperature of the sulfuric acid-hydrogen peroxide water mixture is room temperature, for example.

Then, the hydrofluoric acid cleaning step (S80) is performed. In the hydrofluoric acid cleaning step (S80), a silicon oxide film is removed by hydrofluoric acid, and a surface is terminated with fluorine. The hydrofluoric acid in a mixed solution in which the hydrofluoric acid and ultrapure water are mixed has a concentration of 10% or more and 40% or less, for example. The immersion time of silicon carbide substrate 100 is five minutes or more, for example. The temperature of the sulfuric acid-hydrogen peroxide water mixture is room temperature, for example. In the hydrofluoric acid cleaning step (S80), silicon carbide substrate 100 may be cleaned with the hydrofluoric acid being irradiated with ultrasonic waves.

Figure 6:
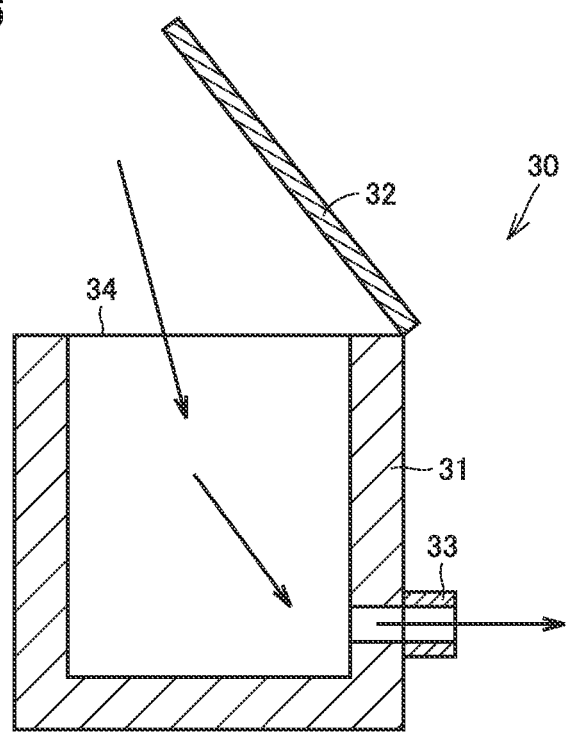
FIG. 6 is a schematic cross sectional view showing a second step of the method for manufacturing the silicon carbide substrate in accordance with the present embodiment.

Then, the drying step (S90) is performed. In the drying step (S90), silicon carbide substrate 100 is dried using a spin drying machine 30, for example. As shown in FIG. 6, spin drying machine 30 includes a main body portion 31, a lid 32, an opening 34, and an exhaust port 33. Spin drying machine 30 is placed in a class 100-equivalent clean room. Before silicon carbide substrate 100 is introduced into spin drying machine 30, air is passed from opening 34 toward exhaust port 33 of spin drying machine 30, with lid 32 of spin drying machine 30 being opened. Main body portion 31 has a volume of 127000 $cm^3$, for example. Opening 34 has an area of 2700 $cm^2$, for example. The amount of the passed air is 60 $m^3$, for example.

Then, silicon carbide substrate 100 is placed in main body portion 31 of spin drying machine 30, and lid 32 is closed. Silicon carbide substrate 100 rotates about a rotation axis substantially perpendicular to first main surface 1, with pressure being reduced through exhaust port 33. The number of rotations of silicon carbide substrate 100 is 800 rpm, for example. The rotation time is 300 seconds, for example. Thereby, the cleaning solution adhering to silicon carbide substrate 100 is removed by centrifugal force.

Next, the function and effect of the present embodiment will be described.

Generally, cleanliness of main surface 1 of silicon carbide substrate 100 is often discussed based on an average value of impurity concentrations measured at a plurality of locations within main surface 1. However, when an impurity is concentrated at a specific location, the average value calculated for the discussion is small, and silicon carbide substrate 100 may be determined as a good-quality item. Actually, when a silicon carbide semiconductor device is fabricated using silicon carbide substrate 100 in which an impurity is concentrated, a leakage current may occur via the impurity.

Through investigations of the cause of adhesion of an impurity to a specific location in a concentrated manner, it has been found that such a phenomenon is caused because powder dust floating in an atmosphere adheres to main surface 1 of silicon carbide substrate 100 during a process for manufacturing silicon carbide substrate 100. For example, since a member made of stainless steel (an alloy which is composed mainly of iron and also contains chromium) is used in a chemical mechanical polishing device used for the chemical mechanical polishing step (S40), powder dust containing iron is produced from the chemical mechanical polishing device. Thus, the atmosphere in the process for manufacturing silicon carbide substrate 100 may contain powder dust containing various types of metal impurities. Powder dust containing a metal impurity causes contamination of silicon carbide substrate 100.

In the sulfuric acid-hydrogen peroxide water mixture cleaning step (S50) for silicon carbide substrate 100 in accordance with the present embodiment, silicon carbide substrate 100 is cleaned with the sulfuric acid-hydrogen peroxide water mixture being irradiated with ultrasonic waves. The ultrasonic waves promote a chemical reaction. This enhances the reactivity of a metal impurity to the sulfuric acid-hydrogen peroxide water mixture. Further, a metal impurity adhering to a specific location in a concentrated manner can be effectively removed by the cavitation effect caused by irradiation of the ultrasonic waves. Accordingly, the concentration of a metal impurity can be reduced in the most region of main surface 1. Specifically, in main surface 1, a total area of a region in which a concentration of each of sodium, aluminum, potassium, calcium, titanium, iron, copper, and zinc is less than $5 \times 10^{10}$ atoms/$cm^2$ can be more than or equal to 95% of an area of main surface 1. Thereby, silicon carbide substrate 100 with a high cleanliness is obtained. As a result, when silicon carbide substrate 100 is used to fabricate a silicon carbide semiconductor device, it is possible to suppress deterioration of electrical properties of the silicon carbide semiconductor device due to a metal impurity.

Further, when silicon carbide substrate 100 is dried after the cleaning step, the spin drying machine may be used.

When silicon carbide substrate 100 is placed within main body portion 31 of the spin drying machine and dried, powder dust adhering to the inside of the spin drying machine, powder dust produced during the operation of the spin drying machine, powder dust floating in an atmosphere around the spin drying machine, or the like may firmly adhere to silicon carbide substrate 100 wetted with the cleaning solution used in the cleaning step. The powder dust contains a metal impurity, and causes contamination of silicon carbide substrate 100.

In the drying step (S90) for silicon carbide substrate 100 in accordance with the present embodiment, before silicon carbide substrate 100 is introduced into spin drying machine 30, air in a certain amount or more is passed from opening 34 toward exhaust port 33 of spin drying machine 30, with lid 32 of spin drying machine 30 being opened. Thereafter, silicon carbide substrate 100 is placed within spin drying machine 30, and drying of silicon carbide substrate 100 is performed. This can suppress the powder dust containing a metal impurity from adhering to main surface 1 of silicon carbide substrate 100. Accordingly, the concentration of a metal impurity can be reduced in the most region of main surface 1. Specifically, in main surface 1, the total area of the region in which the concentration of each of sodium, aluminum, potassium, calcium, titanium, iron, copper, and zinc is less than $5 \times 10^{10}$ atoms/cm$^2$ can be more than or equal to 95% of the area of main surface 1. Thereby, silicon carbide substrate 100 with a high cleanliness is obtained. As a result, when silicon carbide substrate 100 is used to fabricate a silicon carbide semiconductor device, it is possible to suppress deterioration of electrical properties of the silicon carbide semiconductor device due to a metal impurity.

Example (Sample Preparation)

First, silicon carbide substrate 100 in accordance with a sample 1 and silicon carbide substrate 100 in accordance with a sample 2 were prepared. Silicon carbide substrate 100 in accordance with sample 1 was a comparative example. Silicon carbide substrate 100 in accordance with sample 2 was an example. Each silicon carbide substrate 100 had a maximum diameter (diameter) of 150 mm.

Silicon carbide substrate 100 in accordance with sample 2 was manufactured by the manufacturing method in accordance with the present embodiment. Specifically, in the sulfuric acid-hydrogen peroxide water mixture cleaning step (S50), the sulfuric acid-hydrogen peroxide water mixture was irradiated with ultrasonic waves. The ultrasonic waves had a frequency of 950 kHz. The volume ratio among the sulfuric acid, the hydrogen peroxide water, and the ultrapure water contained in the sulfuric acid-hydrogen peroxide water mixture was set to 10 (sulfuric acid):1 (hydrogen peroxide water):1 (ultrapure water). The immersion time of silicon carbide substrate 100 was set to 30 minutes. The temperature of the sulfuric acid-hydrogen peroxide water mixture was set to room temperature. Further, in the drying step (S90) for silicon carbide substrate 100, before silicon carbide substrate 100 was introduced into spin drying machine 30, air was passed from opening 34 toward exhaust port 33 of spin drying machine 30, with lid 32 of spin drying machine 30 being opened. The amount of the passed air was set to 60 m$^3$.

On the other hand, according to a method for manufacturing silicon carbide substrate 100 in accordance with sample 1, in the sulfuric acid-hydrogen peroxide water mixture cleaning step (S50), the sulfuric acid-hydrogen peroxide water mixture was not irradiated with ultrasonic waves. The amount of the passed air was set to 15 m$^3$. Other manufacturing conditions were the same as those of the method for manufacturing silicon carbide substrate 100 in accordance with sample 2.

(Measuring Method)

Then, a concentration of a metal impurity was measured using TXRF-3760 manufactured by Rigaku. The power of the X-ray was set to 35 kV-255 mA. The incidence azimuth was set to 39°. The incident angle of W-Ma was set to 0.500°. The measurement time of W-Ma was set to 10 seconds/point. The incident angle of W-Lb was set to 0.100°. The measurement time of W-Lb was set to 10 seconds/point. As shown in FIG. 3, in 101 measurement regions S in first main surface 1 of silicon carbide substrate 100, a concentration of each of sodium (Na), aluminum (Al), potassium (K), calcium (Ca), titanium (Ti), iron (Fe), copper (Cu), zinc (Zn), sulfur (S), and chlorine (Cl) was measured. The number of measurement regions S in which the concentration of a metal impurity as a measurement target was more than or equal to a reference value was divided by the number of all measurement regions S (101 in total) to calculate a ratio of an area of a region in which the metal impurity as the measurement target was more than or equal to the reference value.

(Result of Measurement)

TABLE 1

| Element | Sample 1 | | Sample 2 | |
|---|---|---|---|---|
| | Ratio of region with more than or equal to $1 \times 10^{12}$ atoms/cm$^2$ (%) | Ratio of region with more than or equal to $5 \times 10^{10}$ atoms/cm$^2$ (%) | Ratio of region with more than or equal to $1 \times 10^{12}$ atoms/cm$^2$ (%) | Ratio of region with more than or equal to $5 \times 10^{10}$ atoms/cm$^2$ (%) |
| Na | 0 | 7 | 0 | 0 |
| Al | 1 | 1 | 0 | 0 |
| K | 1 | 2 | 0 | 1 |
| Ca | 1 | 2 | 0 | 0 |
| Ti | 0 | 1 | 0 | 0 |
| Fe | 0 | 10 | 0 | 0 |
| Cu | 0 | 1 | 0 | 0 |
| Zn | 0 | 1 | 0 | 0 |
| S | 88 | 88 | 68 | 68 |
| Cl | 78 | 78 | 62 | 62 |

Table 1 shows a ratio of areas of measurement regions S in which the concentration of each of sodium (Na), aluminum (Al), potassium (K), calcium (Ca), titanium (Ti), iron (Fe), copper (Cu), zinc (Zn), sulfur (S), and chlorine (Cl) was more than or equal to the reference value. As the reference value, $1\times10^{12}$ atoms/cm$^2$ and $5\times10^{10}$ atoms/cm$^2$ were adopted.

As shown in Table 1, in silicon carbide substrate 100 in accordance with sample 1, ratios of areas of measurement regions S in which the concentration of each of sodium (Na), aluminum (Al), potassium (K), calcium (Ca), titanium (Ti), iron (Fe), copper (Cu), zinc (Zn), sulfur (S), and chlorine (Cl) was more than or equal to $5\times10^{10}$ atoms/cm$^2$ were 7%, 1%, 2%, 2%, 1%, 10%, 1%, 1%, 88%, and 78%, respectively. On the other hand, in silicon carbide substrate 100 in accordance with sample 2, ratios of areas of measurement regions S in which the concentration of each of sodium (Na), aluminum (Al), potassium (K), calcium (Ca), titanium (Ti), iron (Fe), copper (Cu), zinc (Zn), sulfur (S), and chlorine (Cl) was more than or equal to $5\times10^{10}$ atoms/cm$^2$ were 0%, 0%, 1%, 0%, 0%, 0%, 0%, 0%, 68%, and 62%, respectively.

As shown in Table 1, in silicon carbide substrate 100 in accordance with sample 1, ratios of areas of measurement regions S in which the concentration of each of sodium (Na), aluminum (Al), potassium (K), calcium (Ca), titanium (Ti), iron (Fe), copper (Cu), zinc (Zn), sulfur (S), and chlorine (Cl) was more than or equal to $1\times10^{12}$ atoms/cm$^2$ were 0%, 1%, 1%, 1%, 0%, 0%, 0%, 0%, 88%, and 78%, respectively. On the other hand, in silicon carbide substrate 100 in accordance with sample 2, ratios of areas of measurement regions S in which the concentration of each of sodium (Na), aluminum (Al), potassium (K), calcium (Ca), titanium (Ti), iron (Fe), copper (Cu), zinc (Zn), sulfur (S), and chlorine (Cl) was more than or equal to $1\times10^{12}$ atoms/cm$^2$ were 0%, 0%, 0%, 0%, 0%, 0%, 0%, 0%, 68%, and 62%, respectively.

As described above, it has been confirmed that, in silicon carbide substrate 100 in accordance with sample 2, the ratio of the area of a region in which a metal impurity as a measurement target is more than or equal to a reference value can be reduced, when compared with silicon carbide substrate 100 in accordance with sample 1.

It should be understood that the embodiment and the example disclosed herein are illustrative and non-restrictive in every respect. The scope of the present invention is defined by the scope of the claims, rather than the above description, and is intended to include any modifications within the scope and meaning equivalent to the scope of the claims.

REFERENCE SIGNS LIST

1: main surface (first main surface); 2: second main surface; 3: first curved region; 4: second curved region; 5: outer circumferential end portion; 6: chamfered portion; 7: orientation flat portion; 8: arc-shaped portion; 10: center; 12: first cleaning tank; 13: second cleaning tank; 14: first cleaning solution; 15: second cleaning solution; 19: ultrasonic wave generation source; 20: ultrasonic wave cleaning device; 21: first virtual circle; 22: second virtual circle; 23: third virtual circle; 24: fourth virtual circle; 25: fifth virtual circle; 30: spin drying machine; 31: main body portion; 32: lid; 33: exhaust port; 34: opening; 100: silicon carbide substrate; 101: first direction; 102: second direction; S: measurement region; W1: first width; W2: second width.

The invention claimed is:

1. A silicon carbide substrate comprising a main surface, wherein
the silicon carbide substrate has a maximum diameter of 150 mm or more, and
in the main surface, a total area of a region in which a concentration of each of sodium, aluminum, potassium, calcium, titanium, iron, copper, and zinc is less than $5\times10^{10}$ atoms/cm$^2$ is more than or equal to 95% of an area of the main surface.

2. The silicon carbide substrate according to claim 1, wherein the total area is more than or equal to 98% of the area of the main surface.

3. The silicon carbide substrate according to claim 1, wherein
sulfur is present in the main surface, and
a region in which a concentration of the sulfur is more than or equal to $5\times10^{10}$ atoms/cm$^2$ is more than or equal to 1% of the area of the main surface.

4. The silicon carbide substrate according to claim 3, wherein the region in which the concentration of the sulfur is more than or equal to $5\times10^{10}$ atoms/cm$^2$ is more than or equal to 50% of the area of the main surface.

5. The silicon carbide substrate according to claim 1, wherein
chlorine is present in the main surface, and
a region in which a concentration of the chlorine is more than or equal to $5\times10^{10}$ atoms/cm$^2$ is more than or equal to 1% of the area of the main surface.

6. The silicon carbide substrate according to claim 5, wherein the region in which the concentration of the chlorine is more than or equal to $5\times10^{10}$ atoms/cm$^2$ is more than or equal to 50% of the area of the main surface.

7. The silicon carbide substrate according to claim 1, wherein, the main surface, a region in which the concentration of the aluminum is more than or equal to $1\times10^{12}$ atoms/cm$^2$ is less than 1% of the area of the main surface.

8. The silicon carbide substrate according to claim 1, wherein, in the main surface, a region in which the concentration of the potassium is more than or equal to $1\times10^{12}$ atoms/cm$^2$ is less than 1% of the area of the main surface.

9. The silicon carbide substrate according to claim 1, wherein, in the main surface, a region in which the concentration of the calcium is more than or equal to $1\times10^{12}$ atoms/cm$^2$ is less than 1% of the area of the main surface.

* * * * *